United States Patent [19]
Pressesky

[11] Patent Number: 5,963,029
[45] Date of Patent: Oct. 5, 1999

[54] MEASURING MAGNETIC PROPERTIES IN MEDIA BY RMS SIGNAL PROCESSING AND INCREMENTAL ERASURE

[75] Inventor: Jason L. Pressesky, Menlo Park, Calif.

[73] Assignee: Seagate Technology, Inc., Scotts Valley, Calif.

[21] Appl. No.: 08/789,303

[22] Filed: Jan. 30, 1997

Related U.S. Application Data

[60] Provisional application No. 60/010,818, Jan. 30, 1996.

[51] Int. Cl.$^6$ .......................... G01R 33/12; G01N 27/72; G11B 5/02; G11B 27/34
[52] U.S. Cl. ................................ 324/212; 360/25; 369/58
[58] Field of Search ..................................... 324/210–212; 360/25, 31, 66; 369/53, 58

[56] References Cited

U.S. PATENT DOCUMENTS 4,847,558  7/1989  Fisher et al. .

OTHER PUBLICATIONS

"The Gaussian Beam", Fundamentals of Photonics, Saleh, et al, pp. 81–87,, 1991.

*Primary Examiner*—Walter E. Snow
*Attorney, Agent, or Firm*—Frederick W. Niebuhr

[57] ABSTRACT

A system for magnetically evaluating magnetic data storage media includes a spindle for rotatably supporting magnetic disks, a read/write transducer, and an erasing transducer, both supported for radial movement relative to the disk. The read/write transducer records a sequence of magnetically isolated transitions. When sensing the sequence, the read/write transducer generates a fringing field signal which is low pass filtered and RMS processed to provide a voltage proportional to the remanence-thickness product. The erasing transducer is a ring head transducer having a substantially larger gap and transducer/disk spacing as compared to an aerodynamically supported transducer. Consequently a Hall effect probe is positionable within the gap to directly measure the magnetic intensities of erase fields. Coercivity is determined by applying the erase fields in a sequence of increasing intensities, with each application followed by a measurement of the remanence-thickness product, until the remanence-thickness product has been reduced by one-half. The read/write transducer can be aerodynamically supported to more accurately replicate transitions encountered during normal use, or can be of the ring head type to enable testing of the disk at intermediate fabrication stages.

32 Claims, 3 Drawing Sheets

MEASURING MAGNETIC PROPERTIES IN MEDIA BY RMS SIGNAL PROCESSING AND INCREMENTAL ERASURE

This application claims the benefit of Provisional Application Ser. No. 60/010,818 entitled "Rotating Disc Magnetometer (RDM)", filed Jan. 30, 1996.

BACKGROUND OF THE INVENTION

The present invention relates to the evaluation of magnetic data storage media either during or after fabrication, and more particularly to devices and processes for determining magnetic properties in the magnetizable recording layers of such media.

Disk drives employ one or more rotatable disks in combination with transducers supported for generally radial movement relative to the disks. Usually, each transducer is maintained spaced apart from its associated disk at a "flying height" controlled by an air bearing caused by disk rotation. Alternatively in connection with flexible disks, the transducer is part of a recording head maintained in sliding contact with the disk. In either event, each transducer interacts with a magnetizable recording layer of its associated disk—applying magnetic fields to write magnetic transitions (data) into the recording layer, sensing the resulting fringing fields to read the data, or applying erasing fields to remove data previously written.

Magnetic media performance depends largely upon magnetic properties of the recording layer. Important properties in this regard include the coercivity, the remanence-thickness product, and the coercive squareness or switching squareness. The coercivity is the magnetic intensity of an applied magnetic field sufficient to cause the recording layer to undergo a transition from a state of magnetic saturation to a non-magnetized state. The remanence-thickness product indicates the density of magnetic poles in the remanent state and thus relates to the strength of the electrical signal recoverable from a magnetization transition. The coercive squareness or switching squareness describes the rate of change of magnetization as a function of an applied magnetic field, in the vicinity of the coercivity and thus influences writing and transition formation.

There are several known approaches to testing magnetic media for their magnetic properties, including vibrating sample magnetometers for measuring magnetization as a function of an applied magnetic field, and hysteresis testers for measuring flux density as a function of an applied field. These devices, however, are destructive in that they require cutting or otherwise separating a finite element from the recording medium for measurement.

U.S. Pat. No. 4,847,558, assigned to the assignee of this application and incorporated herein by reference, discloses a non-destructive approach for determining coercive force (i.e. coercivity) and remanence-thickness product. In particular, a standard read/write head (magnetic induction transducer) supported on an air bearing, is used to generate currents of increasing strength and thereby apply erasing fields of increasing strength to previously recorded transitions. The magnetic intensities of the applied erase fields are calculated, based on an assumed linear current-field relationship, on the basis that the coercive force coincides with a negative 6 dB signal level, as compared to the signal level before applying the erase current. To determine remanence-thickness product, the isolated half-pulse width of the negative 6 dB signal is calculated.

While this approach offers considerable advantages as compared to destructive testing, several factors limit its utility.

The first of these is the assumption of a linear current-field relationship. The relationship holds true over only a limited range in any event, and its non-linearity is more pronounced when thin film heads and thin film magnetic media are involved.

Second, there are offsets in the current-field relationship due to head remanence.

Third, fluctuations or errors in transducer/disk spacing lead to uncertainties in determining the applied erasing field.

Therefore, it is an object of the present invention to provide a non-destructive process for determining remanence-thickness products of magnetic media by direct measurement of fringing fields from recorded transitions, without the need to determine an isolated pulse width.

Another object is to provide a system for measuring coercivities of magnetic media through direct measurement of erase fields applied to previously recorded transitions, avoiding the need to rely on an assumed erase current/erase field relationship.

A further object of the invention is to provide a device for applying magnetic erase fields to determine magnetic properties of data storage media, in a manner that substantially reduces the chance for errors due to variance in transducer/disk spacing.

Yet another object is to provide a rapid, non-destructive process for measuring magnetic properties and mapping such properties throughout the magnetizable recording layer of a data storage medium.

SUMMARY OF THE INVENTION

To achieve these and other objects, there is provided a system for non-destructively measuring a magnetic property of a magnetic data storage medium. The system includes a media support stage maintaining a magnetic data storage medium, including a magnetizable recording layer, in a selected orientation. A transducing arrangement is disposed proximate the recording layer. It includes at least one magnetic transducing gap of a selected gap length for generating magnetic fields. A transducer positioning arrangement selectively positions the transducing arrangement and the data storage medium relative to one another. This facilitates use of the transducing arrangement to write magnetic transitions, erase magnetic transitions and sense magnetic fringing fields of the magnetic transitions along a selected segment of the recording layer. The transducing arrangement, responsive to sensing magnetic fringing fields, generates an analog electrical fringing field signal.

A magnetic field sensing element is mounted to the transducer arrangement near the transducing head gap, and adapted to measure magnetic intensity and to generate an erase field signal indicating a magnetic intensity of a magnetic erase field during said erasing. A controller, operatively coupled to the transducing arrangement and to the transducer positioning arrangement, further is coupled to receive the fringing field signal and the erase field signal. The controller is adapted to (i) cause the transducing arrangement to write a set of magnetically isolated transitions along the selected segment of the recording layer, and to sense a resulting first magnetic fringing field to generate a first fringing field signal with a first amplitude; and (ii) apply a magnetic erasing field having a target magnetic intensity to said transitions, to form a modified magnetic fringing field that when sensed by the transducing arrangement yields a fringing field signal having a target amplitude substantially equal to a predetermined fraction of the first amplitude. The target magnetic intensity indicates a magnetic property of the magnetic data storage medium along the selected segment.

When the predetermined fraction is one-half, the magnetic property is a coercivity of the data storage medium along the selected segment. Preferably the controller applies magnetic erasing fields in a sequence of incrementally increasing magnetic intensity. Then, the erasing field with said target intensity is the final erasing field applied.

The preferred transducing arrangement includes a read/write transducer for writing the transitions and for sensing the fringing fields and a separate, independently supported erasing transducer for applying the erase fields. The erasing transducer can be a ring head transducer supported in fixed spaced apart relation to the disk, which substantially eliminates errors due to the fluctuations characteristic of aerodynamically supported transducers.

The read/write transducer likewise can be fixed, and of the ring head design. In other applications, the more traditional aerodynamically supported read/write transducer is preferred because it can provide smaller variations in magnetization and record transitions along narrower tracks, to more closely replicate in testing the transitions that will be formed during normal use.

The device is advantageously used in a process for non-destructibly measuring magnetic properties of magnetic data storage media, including the steps of:

a. supporting a magnetic data storage medium having a magnetizable recording layer in a selected orientation;

b. writing a set of magnetically isolated magnetic transitions into the recording layer along a selected segment thereof;

c. sensing a magnetic fringing field resulting from the magnetic transitions and generating a first fringing field signal having a first amplitude as a function of the sensed fringing field;

d. applying a plurality of magnetic erasing fields to the magnetic transitions along the selected segment, in a stepped sequence of incrementally changing magnetic intensities;

e. after applying each magnetic erasing field, sensing the resulting fringing field of the transitions as modified by the preceding application of the erasing field, to generate a modified fringing field signal;

f. during each application of one of the magnetic erasing fields, using a magnetic field sensing element mounted proximate the erasing transducer, to measure a magnetic intensity of the magnetic erasing field; and g. continuing the applying and sensing until generating a final one of the modified fringing field signals having an amplitude reduced by one-half, as compared to the first amplitude.

In accordance with another aspect of the invention, there is a provided a process for non-destructively measuring a magnetic property of a magnetic data storage medium, including the following steps:

a. supporting a magnetic data storage medium, including a magnetizable recording layer, in a selected orientation;

b. writing a set of magnetically isolated magnetic transitions along a selected segment of the recording layer;

c. sensing a resulting magnetic fringing field of said magnetic transitions to generate a fringing field signal;

d. low pass filtering the fringing field signal to generate a low frequency portion of the fringing field signal;

e. averaging the low frequency portion of the fringing field signal over at least one complete cycle thereof, to generate an RMS (root mean square) signal based on that portion; and f. multiplying the RMS signal by a proportionality constant to generate an indication of a magnetic property of the recording layer along the selected segment.

The magnetic property indicated in the preceding process is the remanence-thickness product, which thus is obtained without the need to apply any erase fields to the recorded transitions. This completely eliminates any error associated with applying or measuring an erase field.

A salient advantage of employing special transducers of the ring head design, for both reading/writing and for erasing, is that testing for magnetic properties can occur at an intermediate fabrication stage, i.e. immediately after a thin film or other magnetizable recording layer is applied to a non-magnetic substrate. The recording layer can be tested as to its magnetic properties before the application of any further layers, particularly the protective cover layer that imparts the desired air bearing support of a magnetic induction head slider. This provides a previously unavailable option to test the magnetic layer and modify it as necessary before applying subsequent layers.

Thus in accordance with the present invention, a non-destructive testing of magnetic media results in a more reliable determination of key magnetic properties, including remanence-thickness product, coercivity and coercive squareness. Reliability is enhanced by obtaining remanence-thickness product measurements without the need to apply erase currents. When the application of erase currents is necessary, for example in determining coercivity, reliability is enhanced in that the magnetic intensities of the erase fields are sensed directly, rather than calculated based on an assumed erase current/erase field relationship. Finally, any errors in writing, reading and erasure due to variances in transducer/disk spacing are virtually eliminated by the use of ring head transducers mechanically suspended apart from the disk surfaces.

IN THE DRAWINGS

For a further understanding of the above and other features and advantages, reference is made to the following detailed description and to the drawings, in which.

Figure 1:
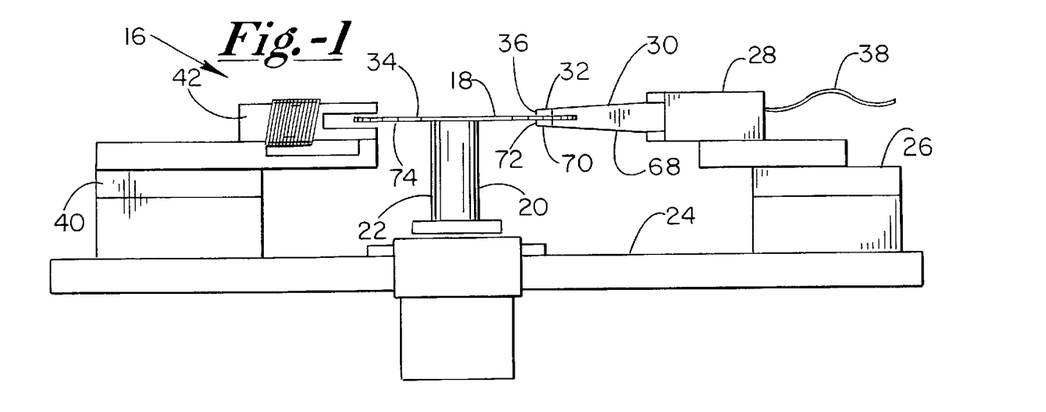
FIG. 1 is a schematic elevation of a system for determining magnetic properties of a magnetic data storage disk.
Figure 2:
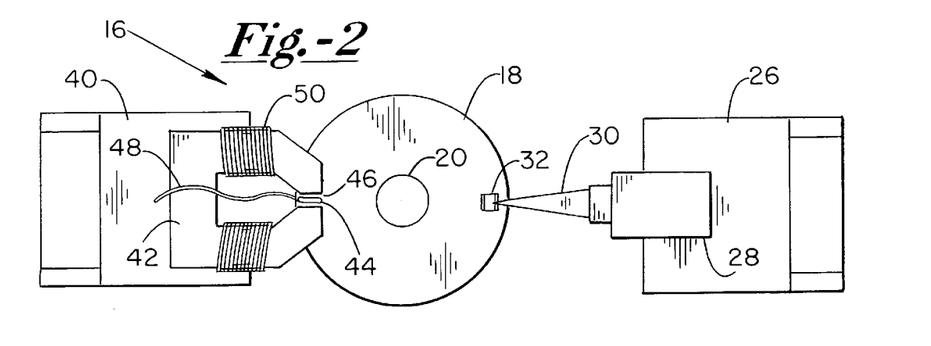
FIG. 2 is a schematic top plan view of the system.

Turning now to the drawings, FIGS. 1 and 2 show a magnetic disk evaluation system 16 for use in a rapid, non-destructive measurement of hysteretic properties of magnetic media, especially magnetizable thin films deposited on rigid disk substrates. Components of the system are employed to write or store magnetic transitions onto the disk; sense magnetic fringing fields from previously written transitions; and apply controllably varied magnetic erase fields to previously written transitions. The purpose of these functions is to measure certain important hysteretic or magnetic properties of the magnetic media, including coercivity (Hc), remanence-thickness product (MrT), and coercive squareness (S*).

In particular, a magnetic disk 18 is supported on a precision air bearing spindle 20 for rotation about a vertical spindle axis at velocities ranging from about 30 to about 120 revolutions per second. Disk 18 is maintained in a horizontal orientation on a spindle shaft 22 that is mounted to a stationary deck 24 through bearings and incorporates a motor with stator windings and a rotor (not shown) to control shaft and disk rotation. Also mounted to deck 24 is a linear slide or carriage 26. A transducing assembly 28 is mounted to the carriage, for reciprocal movement with the carriage radially with respect to the disk and spindle, i.e. to the left and right as viewed in the figures. The transducing assembly includes a head support arm 30 that supports a head slider 32 at its free end, biasing the slider downwardly toward contact with a top surface 34 of the disk. A read/write transducer 36 is mounted on the slider. The slider does not contact surface 34 during operation, but rather is aerodynamically supported above surface 34 by an air bearing created by disk rotation. An electrical conductor 38 electrically couples transducer 36 and a read/write preamplifier and other circuitry, whereby the transducer can be used to write magnetic transitions into a thin film magnetizable recording layer of disk 18, and read magnetic transitions by sensing magnetic fringing fields of the transitions. More particularly, circuitry coupled to the transducer generates analog electrical signals based on the fringing fields.

Deck 24 also supports a carriage 40 for linear travel, whereby an erasing transducer 42 supported on the carriage reciprocates radially with respect to disk 18. A magnetic intensity sensing element, in particular a Hall effect probe 44 is positioned within a magnetic gap 46 of transducer 42. Probe 44 senses the magnetic intensity of the deep gap field of the erasing transducer and provides a signal indicating the intensity to processing circuitry within the system via a conductor 48.

Read/write transducer 36 is an inductive transducer of the type normally present in disk drives in which magnetic disk 18 will be used. Accordingly it is well suited for writing magnetic transitions substantially the same as the transitions expected to be written during use. The resulting magnetic fringing fields, and the sensing of these fields by transducer 36, likewise are quite similar to these aspects as expected in normal use of the disk.

By contrast, erasing transducer 42 is constructed according to classical ring head geometry (as described by Karlquist). As compared to transducer 36, the erasing transducer is much larger, having a gap length on the order of about 100 mils (2.54 mm), as compared to a gap length on the order of about 40 microinches typical of an inductive transducer. Similarly there is a contrast in transducer/disk spacing. While transducer 36 is aerodynamically maintained about 5 microinches (127 nm) above disk 18, erasing transducer 42 is spaced axially from the disk by a distance that can range from about 500 microinches to about 15 mils (12.7–380 microns). Erasing transducer 42 is not aerodynamically supported, but instead mounted structurally for a substantially fixed spacing from disk 18.

Figure 3:
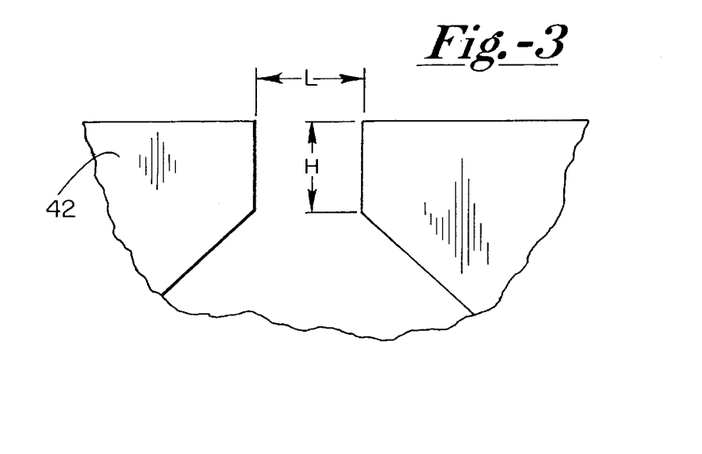
FIG. 3 is an enlarged top view showing a portion of a ring head erasing transducer of the system.

Erasing transducer 42 can have a gap height of about 300 mils (7.6 mm) and a gap width of about 400 mils (10.2 mm). The gap length 1 and height h are shown in FIG. 3, while the width dimension w is perpendicular to the plane of the figure.

Because of its larger separation from the disk, erasing transducer 42 must generate a magnetic field of considerably greater intensity to provide the required erasing fields at surface 34. This requires more turns in a coil 50 of the transducer, a higher level of current through the coils, or both. The advantages, however, more than compensate for the increased power requirement.

First, the erase fields generated by transducer 42 are not nearly so sensitive to transducer/disk spacing as the lower intensity write fields generated by transducer 36. As a result, the application of erasing fields is considerably less prone to error due to normal fluctuations in transducer/disk spacing, e.g. due to momentary axial movement of the disk, or non-planar disk surface features. The mechanically supported transducer is not subject to the fluctuations experienced by aerodynamically supported sliders.

A further, salient feature of the larger scale erasing transducer is that gap 46, unlike the gap in transducer 36, is sufficiently large to accommodate Hall effect probe 44 or another magnetic field sensing device. Thus, the larger scale transducer 42 enables a direct measurement of the deep gap field, i.e. the intensity of an erasing field in the gap and the immediately adjacent region. Of course, for any erase field the magnetic intensity at surface 34 is less than that at the gap, by a proportion that depends on the gap length and transducer/disk spacing. However, determination of these parameters also determines the proportional relationship. The result is a direct measurement of magnetic field intensity, in contrast to the prior art requirement of calculating magnetic intensity based on an assumed linear current-field relationship. Direct measurement of magnetic field intensity facilitates a more accurate determination of coercivity, particularly at higher coercivities and coil currents, where experience demonstrates that the assumed linearity does not hold true.

Figure 4:
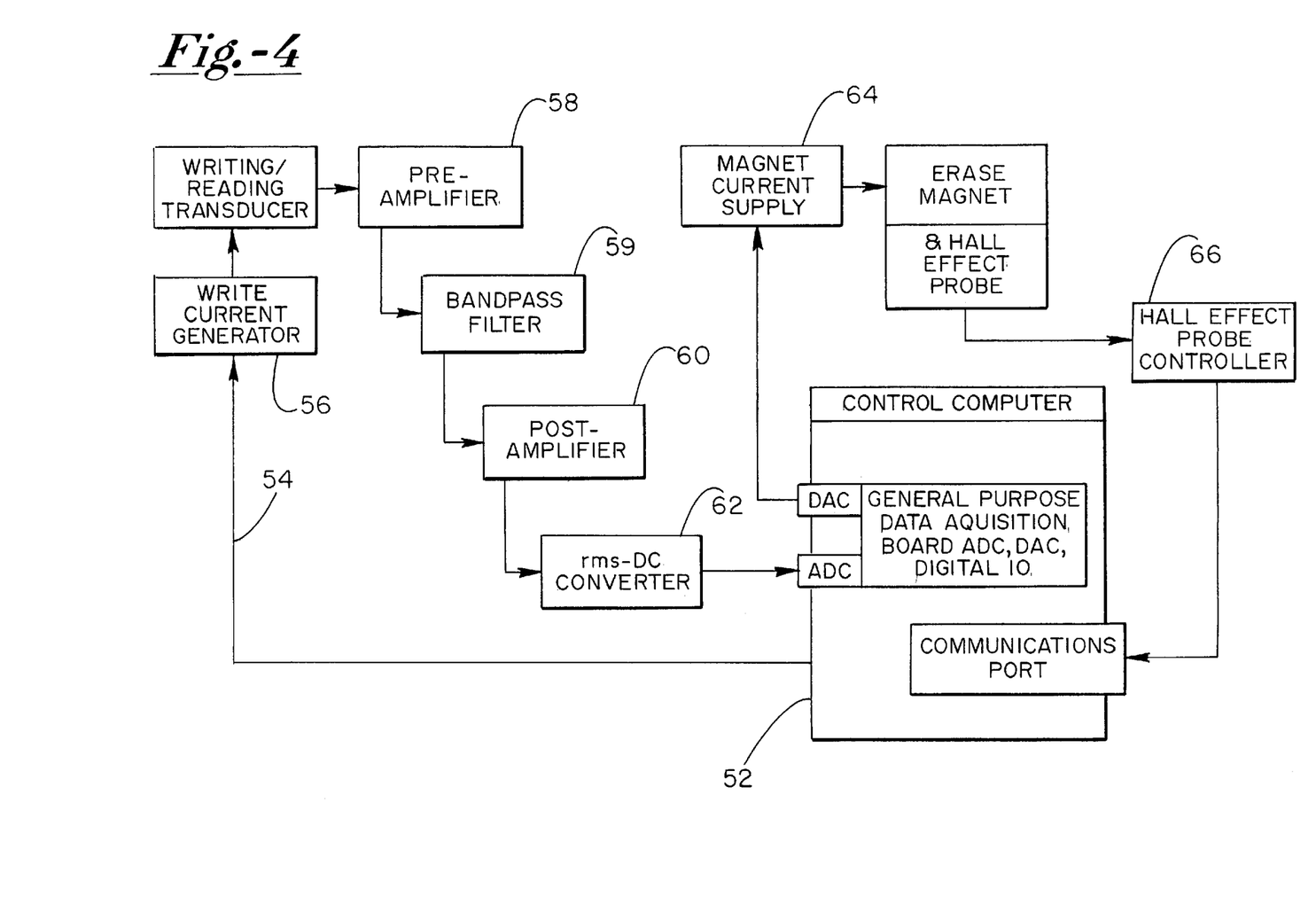
FIG. 4 is a schematic illustration of a demagnetization control logic, of the system, used to determine magnetic properties.

As seen in FIG. 4, the system includes a processor or computer 52 for controlling the writing, reading and erasing operations necessary to determine the selected magnetic properties. Processor 52 provides a write input 54 to a write current generator 56, which in turn causes read/write transducer 36 to write magnetic transitions into a magnetizable recording layer at or near surface 34. For magnetic evaluations of disk 18, the transitions preferably are magnetically isolated. More particularly, in a sequence of the magnetic transitions, adjacent transitions are spaced apart from one another a sufficient distance (e.g. more than about 20 transition widths) so that the demagnetization fields of each transition do not influence the adjacent transitions.

Transducer 36 also is used to read the transitions, specifically by sensing the magnetic fringing fields of previously recorded magnetic transitions, and in response generating an analog electrical signal with a voltage dependent on magnetic intensity. A preamplifier 58 is electrically coupled to the transducer to receive the analog signal. The preamplifier output is provided to a band pass filter 59, which passes only a low frequency portion of the amplified playback signal, e.g. from about 250 to about 750 kHz. The filtered signal is provided to a post amplifier 60, with the further amplified signal then provided to an RMS-DC converting circuit 62. In circuit 62, the playback signal is processed first by an averaging over at least one complete cycle to provide an RMS (root mean square) value. The RMS value can be considered an average amplitude of the playback signal, and more importantly indicates an intensity of the magnetic fringing field sensed by transducer 36. Since the remanence-thickness product (MrT) is proportional to the first harmonic of the playback signal, the low pass filtered, RMS-processed playback signal tends to be proportional to the remanence-thickness product.

After RMS processing, the signal is provided to processor 52, converted to digital data for storage in the processor's internal memory.

Processor 52 also provides a controlling input to a magnetic current supply 64, which in turn controls the intensity of erase fields generated by erasing transducer 42. Hall effect probe 44 continually senses the deep gap field intensity and provides its output to a Hall effect probe controller 66, that provides an electrical voltage input to computer 52 as a measure of erase field intensity. The intensity signal is converted to a digital value for storage in processor 52.

System 16 can be used to measure magnetic properties on both sides of a rigid magnetic disk. As seen in FIG. 1, a second head support arm 68 is mounted to carriage 26 and supports at its free end a slider 70 and transducer 72 for radial movement relative to disk 18, spaced apart from a bottom surface 74 of the disk. There is no "second" erasing transducer, as transducer 42 generates erase fields used in connection with surfaces 34 and 74. Thus, system 16 can be used to simultaneously evaluate the two magnetizable recording layers on opposite sides of disk 18. The magnetic transitions in the respective recording layers preferably are written either in different segments of the disk or in staggered fashion, to facilitate distinguishing these sets of transitions from one another. Further, when particularly thin disks are tested using a system that includes a read/write transducer of the ring head design as discussed below, such an arrangement may be necessary so that magnetic transitions on one side remain isolated from transitions on the other.

A typical magnetic evaluation proceeds as follows. First, read/write transducer 36 is used to write a series of magnetically isolated magnetic transitions along a selected segment of disk 18, e.g. for a selected arcuate or angular length at a selected radius. Then, transducer 36 is used again, to sense the fringing field from the transitions. The playback voltage wave form is detected and processed as discussed above, to yield a signal proportional to the remanence-thickness product. The magnetic transitions preferably are spaced apart from one another equally, to yield a selected frequency when sensed, e.g. on the order of about 500 kHz, which of course depends on the disk rotational speed as well as the spatial separation of transitions.

The constant of proportionality relating the remanence-thickness product and the RMS-processed signal (output of circuit 62) can be determined by calibrating system 16 using magnetic disks of a known remanence-thickness product. Alternatively the proportionality constant can be calculated based on parameters that determine the nature of sensing with transducer 36, such as the playback frequency, number of turns in the coil, and track width. A salient feature of this system is the determination of the remanence-thickness product without the need to determine an isolated pulse width.

The coercivity and coercive squareness are measured through a demagnetization process involving erasing transducer 42. In particular, processor 52, acting through current supply 64, causes transducer 42 to generate a sequence of incrementing erase fields, i.e. erase fields in steps of increasing magnetic intensity, to the selected segment of the disk. Following each application of an erase field, read/write transducer 36 is used to sense the fringing field and generate a remanence-thickness product. As the strength of the applied erase field increases, the remanence-thickness product begins to diminish, and at an increasingly rapid rate, until an erase field of sufficient intensity reduces the remanence-thickness product to one-half of its initial value. The erase field sufficient for this reduction can be thought of as having a "target" magnetic intensity, i.e. the erase field intensity sufficient to reduce the remanence-thickness product to a "target" resultant value equal to one-half the original value.

Figure 5:
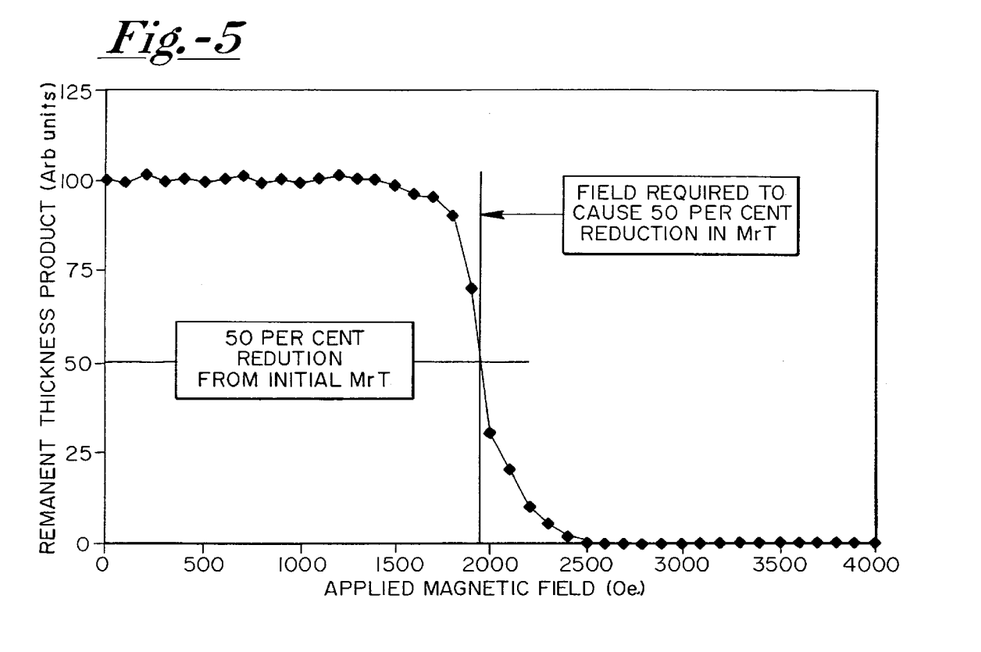
FIG. 5 is a plot of remanence-thickness product as a function of magnetic erase field intensity, further illustrating determination of coercivity and coercive squareness.

The plot in FIG. 5 illustrates remanence-thickness product as a function of the applied erase field, with points along the plot representing increments in the applied erase field as described above. The plot reflects increments of about 100 Oe in the applied erase fields, although other increments can be chosen if desired. The plot also reflects the fact that the target erase field intensity may be determined by interpolation between two points that respectively represent an erase field reducing the remanence-thickness product by less than one-half and the next subsequent erase field that reduces that product by more than one-half. Thus, the exact "target" erase field intensity is not necessarily generated. The test does require at least one "final" erase field that is either equal to or greater than the target intensity.

The erase field required to reduce the initial remanence-thickness product by exactly one-half is defined as the coercivity. The coercive squareness is obtained by determining the slope of the demagnetization plot proximate the coercivity. As noted above, the magnetic field at the recording medium is proportional to the field in the deep gap, and depends on the gap length and the transducer/disk separation. If these dimensions are known, a constant of proportionality may be calculated, which directly relates these magnetic intensities. Alternatively the constant of proportionality is determined by calibrating system 16 using disks of a known coercivity. The coercive squareness is a normalized, dimensionless number that does not require calibration.

Figure 6:
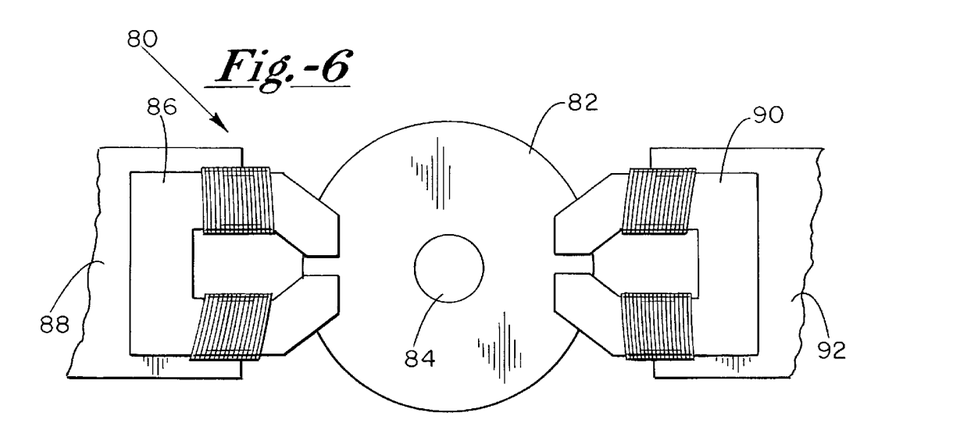
FIG. 6 is a schematic elevation of an alternative embodiment magnetic measurement system.

FIG. 6 illustrates an alternative system 80 in which a disk 82 is supported rotatably on a spindle 84, and an erase transducer 86 is supported on a movable carriage 88 for radial positioning relative to the disk. Transducer 86, like transducer 42, is a ring head transducer.

A read/write transducer 90 also is supported for radial travel, on a carriage 92. In a departure from system 16, read/write transducer 90 is a ring head transducer. The remaining components of system 80, including its control circuitry, are similar to the corresponding components of system 16, and magnetic disks are tested according to a substantially identical protocol.

An advantage of system 80 is that in employing a ring head transducer mounted in a fixed relation to disk 82 for writing and sensing fringing fields, the advantages of fixed positioning and magnetic fields less susceptible to minor axial deviations are realized in writing transitions and in sensing magnetic fringing fields, not just with erasures as in system 16. A disadvantage relative to system 16 is that the transitions written and sensed by ring head transducer 90, due to their size, do not as closely replicate writing and sensing expected during normal use of the disk. In system 80, transitions are spaced to yield a much lower playback frequency than in system 16, e.g. 6 kHz with 3 dB cut-off frequencies of 4 kHz and 8 kHz.

Thus in accordance with the present invention, non-destructive testing of magnetic data storage media yields more accurate measurements of key magnetic properties such as remanence-thickness product, coercivity, and coercive squareness. Reliable measurements can be obtained over a wider range of coercivities and write currents, because of the direct sensing of erase fields. and remanence-thickness products, with no need for an assumed current-field linearity. Also, when the read/write transducer and the erasing transducer are ring head transducers fixed in relation to the disk, the disk can be evaluated at an intermediate fabrication stage, before applying a cover layer or any other layers over the magnetic recording layer. The ring head transducers are virtually unaffected by minor fluctuations in transducer/disk spacing. Reliability further is enhanced by processing magnetic fringing field signals to obtain remanence-thickness products without applying erase fields.

What is claimed is:

1. A system for non-destructively measuring a magnetic property of a magnetic data storage medium, including:
    a media support stage maintaining a magnetic data storage medium in a selected orientation, said data storage medium having a magnetizable recording layer;
    a transducing arrangement disposed proximate the recording layer and including at least one magnetic transducing head gap of a selected gap length for generating magnetic fields;
    a transducing positioning arrangement for selectively positioning the transducing arrangement and the data storage medium relative to one another, to facilitate a use of the transducing arrangement to write magnetic transitions, erase magnetic transitions and sense magnetic fringing fields of the magnetic transitions along a selected segment of the recording layer;
    wherein the transducing arrangement, responsive to said sensing of magnetic fringing fields, generates an analog electrical fringing field signal;
    a magnetic field sensing element mounted to the transducer arrangement near the transducing head gap, adapted to measure magnetic intensity and to generate an erase field signal indicating a magnetic intensity of a magnetic erase field during said erasing; and
    a controller operatively coupled to the transducing arrangement and to the transducer positioning arrangement, and further coupled to receive the fringing field signal and the erase field signal, said controller adapted to: (i) cause the transducing arrangement to write a set of magnetically isolated transitions along the selected segment of the recording layer, and to sense a resulting first magnetic fringing field to generate a first fringing field signal with a first amplitude; and (ii) apply a magnetic erasing field having a target magnetic intensity to said transitions, to form a modified magnetic fringing field that when sensed by the transducing arrangement yields a fringing field signal having a target amplitude substantially equal to a predetermined fraction of said first amplitude; and
    wherein said target magnetic intensity indicates a magnetic property of the magnetic data storage medium along said selected segment.

2. The system of claim 1 wherein:
    said predetermined fraction is one-half, and the magnetic property is a coercivity of the data storage medium along the selected segment.

3. The system of claim 2 wherein:
    said controller is adapted to cause the transducing arrangement to apply a plurality of magnetic erasing fields to said transitions in a sequence of incrementally increasing magnetic intensity, with the erasing field of said target intensity being the final erasing field of said sequence.

4. The system of claim 1 further including:
    a signal processing means receiving the fringing field signals, low pass filtering the fringing field signals and generating root mean square values of the fringing field signals, a first root mean square value based on the first fringing field signal indicating a remanence-thickness product along the selected segment of the recording layer.

5. The system of claim 1 wherein:
    the transducing arrangement comprises a first transducer for said writing the transitions and sensing the fringing fields, and a second transducer, having said head gap, for said applying erasing fields.

6. The system of claim 5 wherein:
    each of the first and second transducers is movable relative to the storage medium independently of the other transducer, and the second transducer is supported in a substantially fixed spaced apart relation to the recording layer.

7. The system of claim 6 wherein:
    the first transducer is supported in a substantially fixed spaced apart relation to the recording surface.

8. The system of claim 6 wherein:
    the first transducer is supported in a spaced apart relation to the recording surface as determined by an air bearing generated by movement of the data storage medium relative to the first transducer.

9. The system of claim 1 wherein:
    said magnetic field sensing element is a Hall effect probe.

10. The system of claim 1 wherein:
    the magnetic data storage medium is a disk, the recording layer is substantially planar, and the transducer positioning arrangement rotates the disk about an axis normal to the recording layer and moves the transducing arrangement radially of the disk.

11. The system of claim 1 further including:
    a means for generating an address to identify a location of the selected segment in the recording layer, and a memory for storing the address, and for storing an indication of a magnetic property in association with the address.

12. A device for measuring a magnetic property of a magnetic data storage medium, including:
    a media support stage maintaining a magnetic data storage medium in a selected orientation, said data storage medium having a magnetizable recording layer;
    a transducing arrangement disposed proximate the recording layer, to write magnetic data transitions in the recording layer, and to sense magnetic fringing fields from the magnetic transitions written in the recording layer and in response generate analog electrical fringing field signals;
    a transducer positioning arrangement for selectively positioning the transducing arrangement and the data storage medium relative to one another, to facilitate the writing of transitions and the sensing of the fringing fields along a selected segment of the recording layer; and
    a signal processing circuit coupled to receive the analog electrical fringing field signals, the signal processing circuit including a low pass filtering component for transmitting only low frequency portions of the fringing field signals, and an averaging circuit component coupled to the filtering component to receive the low frequency portions and to generate RMS (root mean square) values based on said low frequency portions, wherein said RMS values indicate a magnetic property of the recording layer along the selected segment.

13. The device of claim 12 further including:
a conversion circuit component coupled to received the RMS signals and generate DC voltage leveled as a function of the RMS signaled; and an A/D conversion means for receiving the DC voltage levels and generating a digital representation of the magnetic property;
wherein the magnetic property is a remanence-thickness product.

14. The device of claim 12 wherein:
the transition arrangement includes a magnetic read/write transducer.

15. The device of claim 14 wherein:
the magnetic transducer is supported in a substantially fixed spaced apart relation to the data storage medium and the recording surface.

16. The device of claim 14 wherein:
the magnetic transducer is mounted on a slider supported in spaced apart relation to the data storage medium by an air bearing created by movement of the storage medium relative to the slider.

17. The device of claim 12 wherein:
the data storage medium is a disk, the recording layer is substantially planar, and the transducer positioning arrangement is operable to selectively rotate the disk about an axis normal to the recording layer and translate the transducing arrangement radially relative to the disk.

18. The device of claim 14 wherein:
the transducing arrangement further includes an erasing transducer to generate magnetic erasing fields and apply the magnetic erasing fields to the magnetic transitions recorded along the selected segment of the recording layer.

19. The device of claim 18 further including:
a magnetic field sensing element mounted to the erasing transducer for measuring the magnetic intensity of a magnetic erasing field proximate the erasing transducer, and generating an erase field signal that varies with the magnetic intensity of the magnetic erasing field, to enable a determination of an intensity of a given magnetic erasing field in conjunction with a corresponding fringing field signal generated after the given erasing field has been applied to the transitions written along the selected segment.

20. The device of claim 19 wherein:
said given erasing field reduces an amplitude of its corresponding fringing field signal by one-half as compared to a fringing field signal based on the same magnetic transitions generated before the application of any erasing field, whereby the magnetic intensity of the given erasing field represents a coercivity of the data storage medium along the selected segment.

21. The device of claim 18 wherein:
said erasing transducer is supported in a substantially fixed spaced apart relation to the data storage medium and the recording layer.

22. The device of claim 18 wherein:
the reading/writing transducer and the erasing transducer are supported for movement relative to the data storage medium independently of one another.

23. The device of claim 12 further including:
a means for generating an address to locate the selected segment in the recording layer, and a memory for storing the address in conjunction with information concerning the magnetic property.

24. A system for determining the nature of magnetic properties of a magnetic data storage medium, including:
a media support stage maintaining a magnetic data storage medium in a selected orientation, said data storage medium having a magnetizable recording layer;
a magnetic reading/writing transducer disposed proximate the recording layer, for writing magnetic transitions into the recording layer, sensing magnetic fringing fields resulting from the magnetic transitions written into the recording layer, and in response generating analog electrical fringing field signals;
a magnetic erasing transducer supported in a substantially fixed spaced apart relation to the data storage medium at a spacing of at least about 100 microinches from the recording layer, to generate magnetic erasing fields for erasing the magnetic transitions previously written into the recording layer;
a transducer positioning arrangement for selectively positioning the reading/writing transducer and the erasing transducer for movement relative to the data storage medium, to facilitate said writing, sensing and generating erasing fields along a selected segment of the recording layer; and
a controller operatively coupled to the erasing transducer and to the transducer positioning arrangement, and further coupled to receive the fringing field signal, to cause the erasing transducer to apply a plurality of magnetic erasing fields to a plurality of magnetically isolated magnetic transitions written into the recording layer along the selected segment, in a sequence of incrementally increasing magnetic intensities, while causing the reading/writing transducer to generate one of the fringe field signals after the application of each erasing field, until a final fringing field signal, generated after the application of a final erasing field of the sequence, has an amplitude at most equal to one-half the amplitude of an initial fringing field signal based on the same magnetic transitions sensed before the application of any erasing field.

25. A process for non-destructively measuring a magnetic property of a magnetic data storage medium, including:
supporting a magnetic data storage medium, including a magnetizable recording layer, in a selected orientation;
writing a set of magnetically isolated magnetic transitions along a selected segment of the recording layer;
sensing a resulting magnetic fringing field of said magnetic transitions to generate a fringing field signal;
low pass filtering the fringing field signal to generate a low frequency portion of the fringing field signal;
averaging the low frequency portion of the fringing field signal over at least one complete cycle thereof, to generate an RMS (root mean square) signal based on said portion; and
multiplying the RMS signal by a proportionality constant to generate an indication of a magnetic property of the recording layer along the selected segment.

26. The process of claim 25 further including:
applying a plurality of magnetic erasing fields to the transitions along the selected segment, in a stepped sequence of increasing magnetic intensity;
following each said application, sensing a resulting fringing field of said magnetic transitions, to generate a further fringing field signal based on said magnetic transitions modified to reflect the application of the erasing field;

repeating said applying and sensing until said sensing results in a further fringing field signal having an amplitude reduced by one-half as compared to the fringing field signal generated before applying any magnetic erasing field.

27. A process for non-destructively measuring a magnetic property of a magnetic data storage medium, including:

supporting a magnetic data storage medium having a magnetizable recording layer in a selected orientation;

writing a set of magnetically isolated magnetic transitions into the recording layer along a selected segment thereof;

sensing a magnetic fringing field resulting from said magnetic transitions and generating a first fringing field signal having a first amplitude as a function of the sensed fringing field;

applying a plurality of magnetic erasing fields to said magnetic transitions along the selected segment, in a stepped sequence of incrementally changing magnetic intensities;

after applying each magnetic erasing field, sensing the resulting fringing field of said transitions as modified by the preceding application of the erasing field, to generate a modified fringing field signal;

during each application of one of said magnetic erasing fields, using a magnetic field sensing element mounted proximate the erasing transducer, to measure a magnetic intensity of the magnetic erasing field; and continuing said applying and sensing, until generating a final one of said modified fringing field signals having an amplitude reduced by at least one-half, as compared to the first amplitude.

28. The process of claim 27 wherein:

said sequence of the erasing fields is a sequence of incrementally increasing magnetic intensities that results in a sequence of diminishing amplitudes of the modified fringing field signals.

29. The process of claim 27 further including:

low pass filtering said fringing field signal to generate a low frequency segment of the signal, averaging the low frequency segment over at least a complete cycle thereof to generate an RMS signal, and converting the RMS signal to a direct current voltage level indicating a remanence-thickness product of the data storage medium along the selected segment.

30. A system for non-destructively measuring a magnetic property of a magnetic data storage medium, including:

a media support means for maintaining a magnetic data storage medium in a selected orientation;

a transducing means positionable proximate a recording layer of a data storage medium and including at least one magnetic transducing head gap of a selected gap length for generating magnetic fields;

a positioning means for selectively positioning the transducing means and the data storage medium relative to one another, to facilitate use of the transducing means to write magnetic transitions into the recording layer, apply magnetic erasing fields to the magnetic transitions, and sense magnetic fringing fields of the magnetic transitions to generate analog electrical fringing field signals;

a magnetic field sensing element mounted to the transducing means and disposed near the transducing head gap, for generating erase field signals indicating magnetic erasing field intensity during said application of the magnetic erasing fields; and a control means operatively coupled to the transducing means, to the positioning means, and to the sensing element, for (i) causing the transducing means to write a set of magnetically isolated transitions into the recording layer, and generating a first fringing field signal with a first amplitude; and then (ii) applying a magnetic erasing field having a target magnetic intensity to said transitions, to form a modified magnetic fringing field that when sensed by the transducing means yields a fringing field signal having a target amplitude equal to at most about one-half of the first amplitude; and a means for storing a value representing said target magnetic intensity to indicate a magnetic property of the magnetic data storage medium.

31. The system of claim 30 wherein:

said control means is adapted to cause the transducing means to apply a plurality of magnetic erasing fields to said transitions in a sequence of incrementally increasing magnetic intensities, with the magnetic erasing field having said target intensity being a final erasing field of the sequence.

32. The system of claim 30 wherein:

said transducing means comprises a first transducer for writing the transitions and sensing the fringing fields, and a second transducer having said transducing head gap, for applying said magnetic erasing fields.

* * * * *